United States Patent [19]
Zambrano et al.

[11] Patent Number: 5,464,993
[45] Date of Patent: Nov. 7, 1995

[54] MONOLITHIC INTEGRATED BRIDGE TRANSISTOR CIRCUIT AND CORRESPONDING MANUFACTURING PROCESS

[75] Inventors: Raffaele Zambrano, San Giovanni La Punta; Sergio Palara, Aci Castello, both of Italy

[73] Assignee: Consorzio per la Ricerca sulla Microelettronica nel Mezzogiorno, Catania, Italy

[21] Appl. No.: 124,245

[22] Filed: Sep. 20, 1993

[30] Foreign Application Priority Data

Sep. 18, 1992 [EP] European Pat. Off. .............. 92830506

[51] Int. Cl.$^6$ .................................................. H01L 29/10
[52] U.S. Cl. ........................ 257/140; 257/141; 257/378; 363/132
[58] Field of Search ................................... 257/140, 141, 257/337, 139, 378; 363/98, 132, 56

[56] References Cited

U.S. PATENT DOCUMENTS

| | | | |
|---|---|---|---|
| 4,589,004 | 5/1986 | Yasuda et al. | 257/337 |
| 4,896,196 | 1/1990 | Blanchard et al. | 257/341 |
| 4,949,142 | 8/1990 | Contiero et al. | 257/337 |
| 5,023,691 | 6/1991 | Hagino | 257/139 |
| 5,107,151 | 4/1992 | Cambier . | |
| 5,123,746 | 6/1992 | Okado | 363/37 |
| 5,231,563 | 7/1993 | Jitaru | 363/98 |
| 5,315,497 | 5/1994 | Severinsky | 363/34 |
| 5,317,180 | 5/1994 | Hutter et al. | 257/337 |

FOREIGN PATENT DOCUMENTS 0451286 10/1991 European Pat. Off. .
3070477 3/1991 Japan .

OTHER PUBLICATIONS

"Power losses of the cascode connection compared to a single common-emitter bipolar transistor," Nov. 1981, Electronic Engineering, p. 67.

3rd International Symposium on Power Semiconductor Devices, and ICS April 22, 1991, Maryland USA/Miyazaki etc. "A Novel High Voltage 3-Phase Monolithic Inverter IC" pp. 248–253.

Primary Examiner—Sara W. Crane
Assistant Examiner—Courtney A. Bowers
Attorney, Agent, or Firm—Robert Groover; Betty Formby

[57] ABSTRACT

A monolithically integrated, transistor bridge circuit of a type suiting power applications, comprises at least one pair of IGBT transistors (M1,M2) together with vertically-conducting bipolar junction transistors transistors (T1,T2). These IGBT transistors are laterally conducting, having drain terminals (9,19) formed on the surface of the integrated circuit (1), and through such terminals, they are connected to another pair of transistors (T1,T2) of the bipolar type.

27 Claims, 3 Drawing Sheets

MONOLITHIC INTEGRATED BRIDGE TRANSISTOR CIRCUIT AND CORRESPONDING MANUFACTURING PROCESS

CROSS-REFERENCE TO RELATED APPLICATION

This application claims priority from EPC App'n 92830506.9, filed Sep. 18, 1992, which is hereby incorporated by reference.

BACKGROUND AND SUMMARY OF THE INVENTION

This invention relates to a monolithically integrated, transistor bridge circuit and a method for the manufacture thereof.

More particularly, the invention relates to a bridge circuit made up of power transistors operated at a high voltage which may exceed 250 volts, although the description which follows will make reference to an application of this kind merely for convenience of illustration.

As is known, bridge circuits are widely used for a large number of applications on account of their ability to equalize currents being supplied to an electric load.

For such specific applications, integrated circuits incorporating bipolar transistors or field-effect transistors in a half-bridge configuration have been provided in the past. A circuit of that type is described, for example, in Italian Patent No. IT 1204522 of SGS-Thomson, which is hereby incorporated by reference.

Another known technical solution is described in European Patent Application No. 91830513.7 (which is hereby incorporated by reference), which relates to an integrated bridge circuit of the type designed to optimize power losses. The approach of this application has proved advantageous by virtue of its high conversion efficiency and its ability to operate on high currents, but does not provide for integration of all the power components on a single chip.

The present invention advantageously provides a transistor bridge circuit which has such structural and functional features as to enable monolithic integration of high-voltage elements, while overcoming the current limitations of prior art embodiments. This is accomplished by combining high current-carrying IGBT devices, in combination with junction bipolar devices, into the integrated circuit. Preferably the IGBT devices are connected between output nodes and a positive power supply connection, and the junction bipolar devices are connected between the output nodes and ground.

The present invention also advantageously provides a bridge circuit which can be readily manufactured, and a process for manufacturing it.

BRIEF DESCRIPTION OF THE DRAWING

The present invention will be described with reference to the accompanying drawings, which show important sample embodiments of the invention and which are incorporated in the specification hereof by reference, wherein.

DESCRIPTION OF THE PREFERRED EMBODIMENTS

Figure 1:
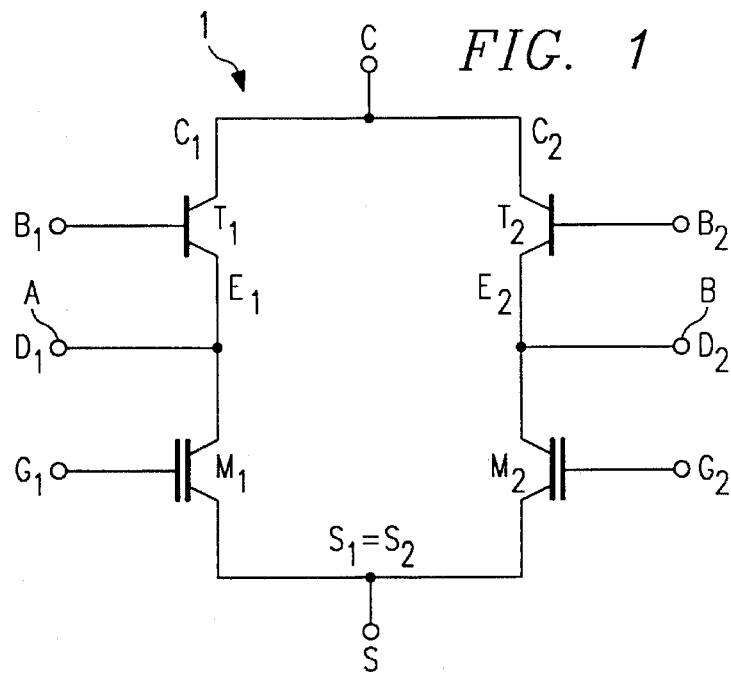
FIG. 1 is a diagrammatic representation of a bridge circuit according to the invention.

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

With reference to the drawing figures, generally and schematically shown at 1 is a bridge circuit embodying this invention in the mixed bipolar/MOS technology and being integrated monolithically on a wafer of semiconductor silicon.

The circuit 1 comprises two opposing output nodes A, B and two opposing supply nodes C, S. Connected between the first supply node C and each of the output nodes A and B, is a corresponding bipolar transistor T1, T2.

In a similar manner, between the second supply node S and each of the output nodes A, B is a corresponding power electronic device M1, M2. More particularly, each device M1, M2 is an insulated-gate bipolar transistor, commonly known by the acronym IGBT (Insulated-Gate Bipolar Transistor), which is constructed in the MOS technology.

The respective gate terminals of such IGBT transistors M1, M2 are denoted by the references G1 and G2, while the respective base terminals of the bipolar transistors T1, T2 are denoted by the references B1, B2.

The upper portion of the bridge 1, comprising the bipolar transistors T1 and T2, is connected to the lower portion, comprising the IGBT devices M1, M2, through respective connections of the emitters E1, E2 of the first transistor pair to the drain terminals D1, D2 of the second pair.

The collectors C1, C2 of the first transistor pair T1, T2 are connected together into the first supply node C.

The source terminals S1, S2 of the second transistor pair M1, M2 are connected together into the second supply node S.

Figure 2:
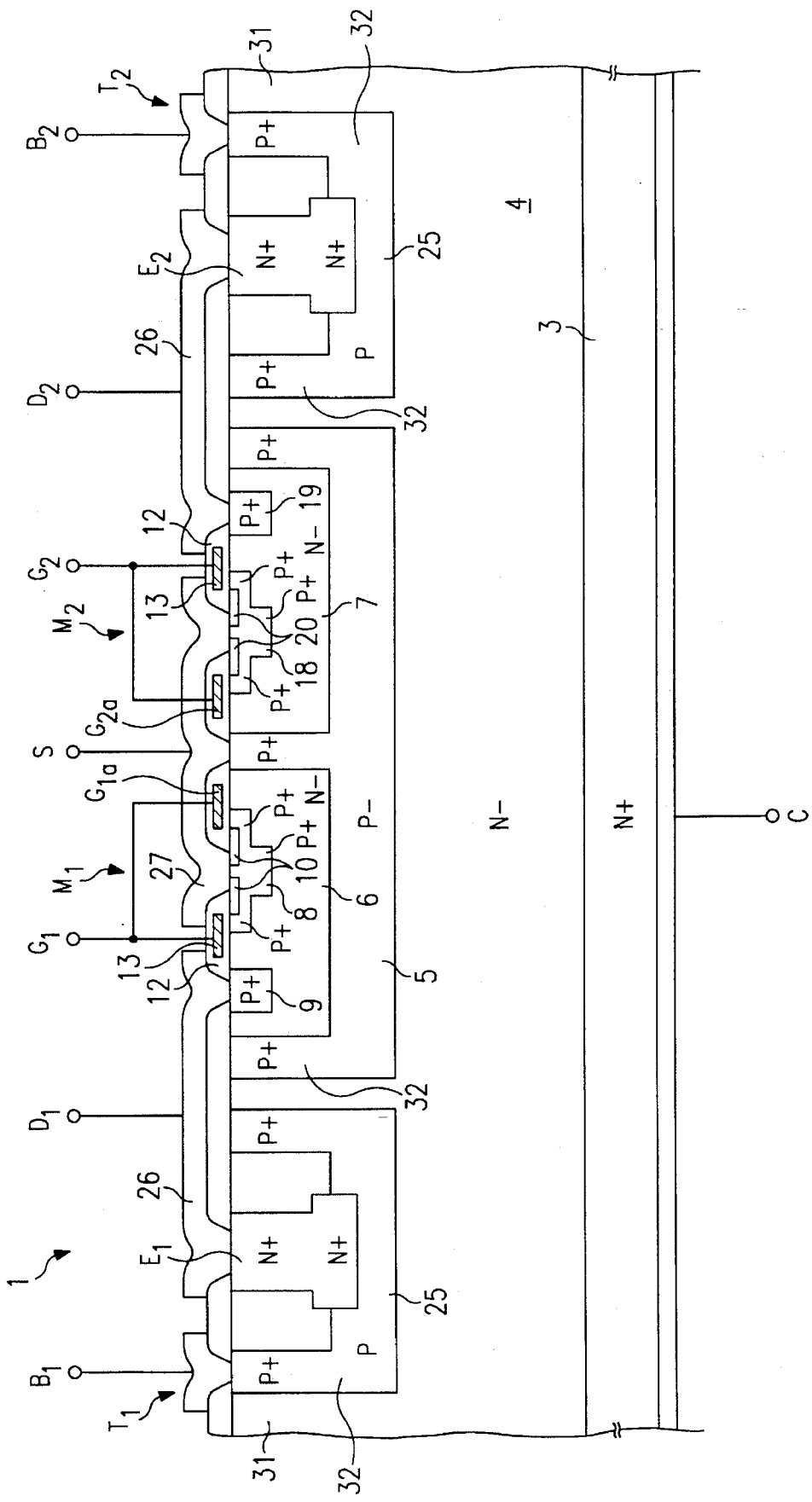
FIG. 2 shows, schematically and drawn to an enlarged scale, a vertical section through the structure of a monolithic semiconductor device incorporating the bridge circuit of this invention.

With specific reference to the example shown in FIG. 2, shown therein are the details of the monolithic structure of this circuit 1 as yielded by the manufacturing process of this invention.

Provided over the semiconductor wafer is a monocrystalline silicon substrate 3, being doped N+ and having an epitaxial layer 4 with conductivity N− formed thereon.

Formed within this epitaxial layer 4 is a P-doped isolation well 5 adapted to receive and hold the IGBT transistors M1 and M2.

To create such transistors M1, M2, the well 5 is provided with two discrete epitaxial regions 6 and 7, doped N−.

In each of said regions 6 and 7, two discrete areas, doped P+, are diffused. These areas have been referenced 8 and 9 for transistor M1 and 18 and 19 for transistor M2.

The areas 8 and 18 constitute the so-called deep bodies of the two transistors, M1 and M2, while the areas 9 and 19 are the respective drain active areas of each transistor M1, M2. Associated with the areas 8 and 18 are also the related bodies doped P–.

Two additional discrete regions, doped N, are formed, as by diffusion, within each of the two bodies 8 and 18.

These regions represent source active areas of the IGBT devices. Indicated at 10 are two sources of transistor M1, and at 20 two sources of transistor M2.

Between each respective source area 10, 20 and drain area 9, 19, the gate terminal G1, G2 of the associated transistor is formed in a manner known per se. By providing two source active areas in each body 8, 18, the perimeter of the channel region can be doubled.

In fact, terminals G1a and G2a are provided which are connected in parallel with each gate G1, G2.

Each of the gate terminals G1, G1a, G2, G2a is formed by a layer 13 of polycrystalline silicon deposited over an insulating oxide layer 12.

Also provided is a shorting link between the source regions 10 and 20 and the corresponding body 8, 18 of the associated transistor.

As shown in FIG. 2, a metallization layer 27 interconnects the body/source shorts and the well 5, to be then run to the output node 8.

It may be noted that, with the structure just described and illustrated, two lateral conduction IGBT devices M1, M2 are provided which are characterized by having their drain terminals 9, 19 at the semiconductor surface.

The circuit 1 structure is completed by the provision of the bipolar transistors T1, T2 located at the sides of the well 5 which encloses and isolates the IGBT devices.

The transistors, T1 and T2, are formed in a manner known per se using a conventional process.

The transistors T1 and T2 are each formed of a base region 25, doped P, wherein a corresponding emitter region E1 or E2, doped N+, is diffused.

Advantageously, each emitter E1, E2 is connected, through a metallization 26, to the corresponding drain terminal 9, 19 of the IGBT transistor, as also illustrated by the diagram in FIG. 1.

Figure 3:
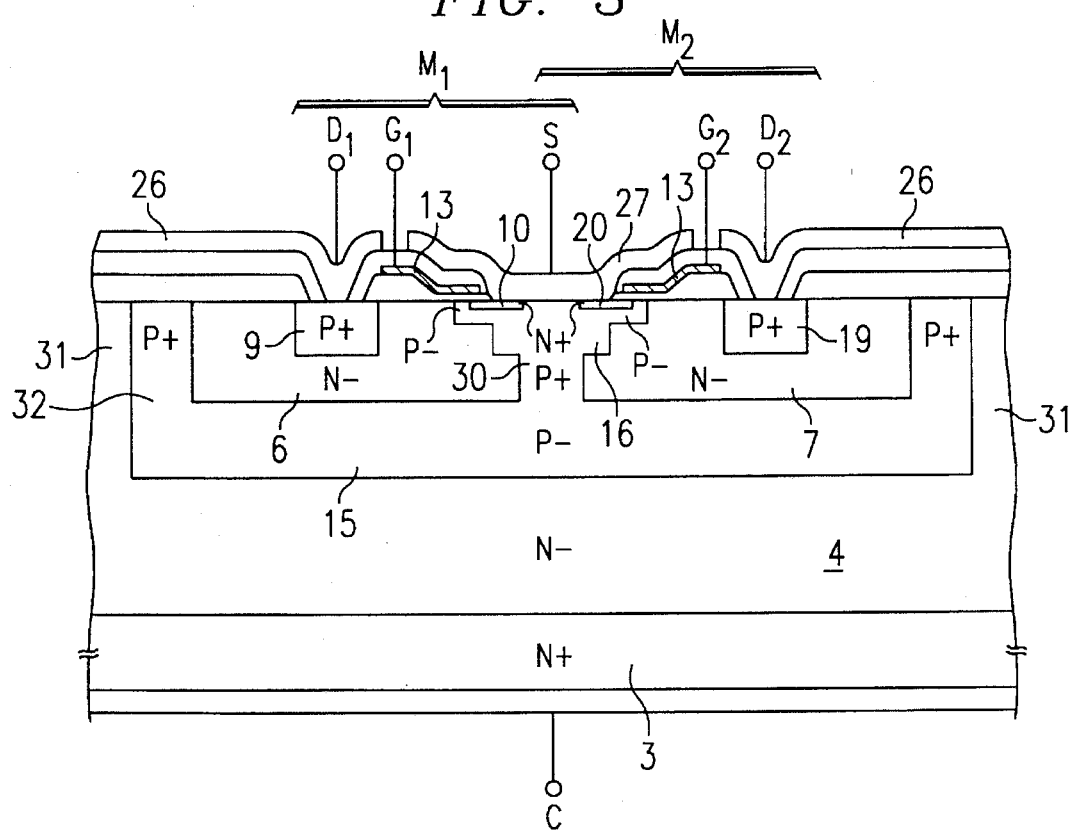
FIG. 3 is a diagrammatic detail view of a modified embodiment of the device shown in FIG. 2.

In the interest of a simplification of the structure herein, a portion of a modified embodiment of the inventive circuit is depicted, to a slightly enlarged scale, in FIG. 3 which has a single body region 16 in common with an isolation well 15.

It should be noted that in the embodiment of FIG. 3, elements with the same construction and operation as in the previously described embodiment are denoted by the same references.

A single isolation well 15 accommodates both the first IGBT transistor and the second.

Formed within the well 15 are the two epitaxial regions 6 and 7. The drain 9 of the first transistor M1 is diffused through the first region 6, whilst the second region 7 accommodates the drain 19 of the second transistor M2.

A single diffused body region 16 is, on the other hand, shared by the two transistors and connected to the well 15 through a region 30 (FIG. 3) bounded by the epitaxial regions 6 and 7.

Formed within the last-mentioned body region 16 are the sources 10 and 20, each on the side of the corresponding transistor M1 or M2.

The gate terminals G1 and G2 are formed conventionally between the respective drain and source terminals, 9–10 and 19–20, of each transistor M1, M2.

This, the second, embodiment affords IGBT integrated transistors of a specially compact design, thereby minimizing the silicon area occupied by the integrated circuit.

Advantageously, since the IGBT transistors are to pass high currents, the structure described with reference to FIG. 3 may be duplicated to connect in parallel several transistors of one type.

Figure 4:
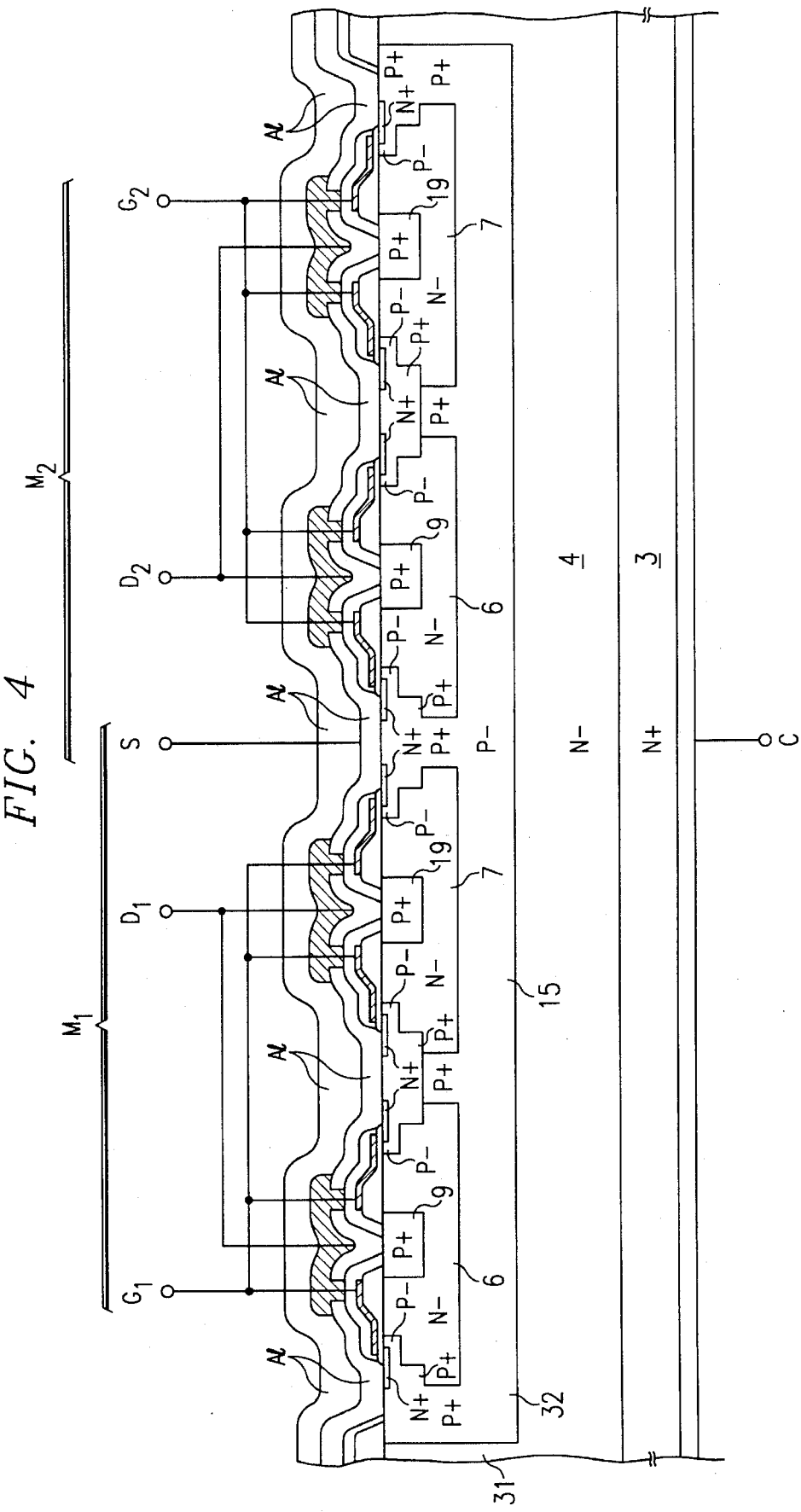
FIG. 4 illustrates schematically an exemplary application of the variation shown in FIG. 3.

Shown in FIG. 4 is an embodiment wherein each transistor, M1 or M2, is constructed by associating two of the semiconductor devices shown in FIG. 3, in parallel together.

To summarize, the drain regions 9 and 19, doped P+, and the source regions 10 and 20, have been adequately connected together.

This basic structure is, moreover, duplicated such that each of the transistors M1 and M2 is composed of another two IGBT transistors parallel connected together. To this aim, a double metallization level can be employed as shown in FIG. 4.

To summarize the process steps which are implemented by the bridge circuit of this invention, the essential steps involved in the manufacturing process will be suitably listed sequentially herein below.

Subsequently to growing the epitaxial layer 4 over the substrate 3, the process sequence includes the formation of the buried layer, doped P, which is to provide the well 5 and base regions 25 for the bipolar transistors T1, T2.

Thereafter, the buried layers, doped N+, for the emitters E1, E2 are formed, followed by the growth of a second epitaxial layer 31 and the definition, within this epitaxial layer 31, of isolation regions 32 which bound the portions 6 and 7 of said epitaxial layer 31.

At this stage, a series of oxide deposition, photomasking and chemical etching operations are performed to define the deep body areas 8 and 18, and the drain active areas 9, 19 bounded by field oxide.

The semiconductor is then covered with a layer 12 of polycrystalline silicon wherein pits are defined to provide the source active areas 10 and 20, doped N+.

Subsequently, the body regions doped P– are defined.

Conventional final steps of contact opening, metallization and passivation complete the manufacturing sequence.

The bridge circuit of this invention does solve, in all of its embodiments, the technical problem, and achieves a number of advantages, foremost of which is that it can ensure a high current flow to the load.

Another advantage resides in the smaller integrated circuit area occupied and consequent savings in layout.

It should be additionally noted that the solution provided by this invention can operate effectively at high voltages, even in excess of 250 volts, and still be highly stable in operation.

Note that the IGBT devices, in the presently preferred embodiment, are being used in a lateral-current-flow mode of operation. This has the advantage that (as compared with high-voltage MOSFETs) the lateral IGBTs can modulate the conductivity of the N-type layer, and therefore reduced voltage drops can be achieved in the saturation regime.

In the embodiment shown, control terminal $G_1$ is connected to $B_2$, and $G_2$ is connected to $B_1$. The signals at B1 and B2 are in phase opposition.

In an application, terminal S would typically be connected to ground, terminal C would be connected to Vcc, and the load (typically a motor) would be connected between D1 and D2.

The disclosed structure can be used for various application, including not only control of small motors from mains power, but also other high-voltage applications such as power inversion.

In a sample process flow, an N− epitaxial layer is grown on an N+ substrate. The P-type buried layer, bipolar base regions, and N-type buried layer are then formed, and another N− epitaxial layer is then grown. An N-well is then formed (e.g. by implanting 2.5E12 cm$^{-2}$ of P at 160 KeV, followed by growth of 500 Å of oxide at the surface). A P-well is then formed (if needed for CMOS), followed by isolation and sinker diffusions. A P-type deep-body diffusion is then formed (which will provide the drain for the IGBT transistor). Field oxide is then formed, to expose "active" locations where active devices may be formed. This is followed by fabrication of polysilicon layer, P- body region, source regions, contacts, metal, and passivation (overcoat). Of course, this is only one example of a possible fabrication sequence, and it will readily be appreciated that skilled process engineers may vary this sequence in many ways.

Further Modifications and Variations

It will be recognized by those skilled in the art that the innovative concepts disclosed in the present application can be applied in a wide variety of contexts. Moreover, the preferred implementation can be modified in a tremendous variety of ways. Accordingly, it should be understood that the modifications and variations suggested below and above are merely illustrative. These examples may help to show some of the scope of the inventive concepts, but these examples do not nearly exhaust the full scope of variations in the disclosed novel concepts.

In one class of embodiments, the drain terminals of the insulated-gate-bipolar devices are also connected to emitter terminals of a second pair of bipolar junction transistors.

In another alternative class of embodiments, the IGBTs each have a P-type source region connected to the positive power supply connection, and the bipolar junction transistors each have an N-type emitter region connected to ground.

As will be recognized by those skilled in the art, the innovative concepts described in the present application can be modified and varied over a tremendous range of applications, and accordingly the scope of patented subject matter is not limited by any of the specific exemplary teachings given.

What is claimed is:

1. A microelectronic device, connectable to a first, positive supply voltage and a second, more negative, supply voltage at respective first and second power supply connections, comprising:

first and second insulated-gate-bipolar (IGBT) transistors, integrated on a common substrate, each having an N-type source region connected to said second power supply connection;

first and second bipolar junction transistors, integrated with said insulated-gate-bipolar transistors on said common substrate, and each having an N-type collector region connected to said first power supply connection;

wherein said first insulated-gate-bipolar transistor and said first bipolar junction transistor are connected together in series, and wherein said second insulated-gate-bipolar transistor and said second bipolar junction transistor are connected together in series;

wherein a respective gate terminal of said first insulated-gate-bipolar transistor is operatively connected to a respective base terminal of said second bipolar junction transistor, and a respective gate terminal of said second insulated-gate-bipolar transistor is operatively connected to a respective base terminal of said first bipolar junction transistor.

2. The device of claim 1, wherein said insulated-gate-bipolar transistors are configured to operate in a lateral conduction mode.

3. The device of claim 1, wherein said insulated-gate-bipolar transistors are configured to operate in a lateral conduction mode, and said bipolar junction transistors are configured to operate in a vertical conduction mode.

4. A microelectronic circuit device, comprising:

first and second insulated-gate-bipolar (IGBT) transistors, integrated on a common substrate;

first and second bipolar junction transistors, integrated with said insulated-gate-bipolar transistors on said common substrate;

wherein said first insulated-gate-bipolar transistor and said first bipolar junction transistor are connected together in series, and wherein said second insulated-gate-bipolar transistor and said second bipolar junction transistor are connected together in series;

wherein a respective gate terminal of said first insulated-gate-bipolar transistor is operatively connected to a respective base terminal of one of said bipolar junction transistors, and wherein a respective gate terminal of said second insulated-gate-bipolar transistor is operatively connected to a respective base terminal of another one of said bipolar junction transistors.

5. The device of claim 4, wherein said insulated-gate-bipolar transistors are configured to operate in a lateral conduction mode.

6. The device of claim 4, wherein said insulated-gate-bipolar transistors are configured to operate in a lateral conduction mode, and said bipolar junction transistors are configured to operate in a vertical conduction mode.

7. The device of claim 4, wherein said first insulated-gate-bipolar transistor and said first bipolar junction transistor are connected together in series between first and second power-supply connections, and wherein said second insulated-gate-bipolar transistor and said second bipolar junction transistor are connected together in series between said first and second power-supply connections, and wherein a first output connection is provided between said first insulated-gate-bipolar transistor and said first bipolar transistor, and wherein a second output connection is provided between said second insulated-gate-bipolar transistor and said second bipolar.

8. An integrated microelectronic device, comprising:

first and second insulated-gate-bipolar (IGBT) power transistors, integrated on a common substrate;

first and second bipolar junction power transistors, integrated with said insulated-gate-bipolar transistors on said common substrate;

wherein said first insulated-gate-bipolar transistor and said first bipolar junction transistor are connected together in series between first and second power-supply connections, and wherein said second insulated-gate-bipolar transistor and said second bipolar junction transistor are connected together in series between said first and second power-supply connections;

wherein a respective gate terminal of said first insulated-gate-bipolar transistor is operatively connected to a respective base terminal of one of said bipolar junction transistors, and wherein a respective gate terminal of said second insulated-gate-bipolar transistor is operatively connected to a respective base terminal of another one of said bipolar junction transistors;

and wherein a node intermediate said first transistors is connected to provide a first output, and a node intermediate said second transistors is connected to provide a second output.

9. The device of claim 8, wherein said insulated-gate-bipolar transistors are configured to operate in a lateral conduction mode.

10. The device of claim 8, wherein said insulated-gate-bipolar transistors are configured to operate in a lateral conduction mode, and said bipolar junction transistors are configured to operate in a vertical conduction mode.

11. The device of claim 8, wherein a first output connection is provided between said first insulated-gate-bipolar transistor and said first bipolar transistor, and wherein a second output connection is provided between said second insulated-gate-bipolar transistor and said second bipolar.

12. A monolithically integrated, transistor bridge circuit, being of a suitable type for power applications, comprising:

at least one transistor pair of an insulated-gate-bipolar type;

at least one pair of bipolar junction transistors, integrated with said insulated-gate-bipolar transistor pair;

wherein said insulated-gate-bipolar transistor pair are formed within an isolation well accommodating respective epitaxial region portions wherein respective drain and source active regions of each said insulated-gate-bipolar transistor are formed.

13. A bridge circuit according to claim 12, wherein each said insulated-gate-bipolar transistor comprises a source region which is contained in a corresponding single body region.

14. A bridge circuit according to claim 13, wherein said source regions and said corresponding body regions of each said insulated-gate-bipolar transistor are shorted to each other.

15. The device of claim 1, wherein said bipolar junction transistors are NPN transistors.

16. The device of claim 1, wherein said bipolar junction transistors have buried emitters.

17. The device of claim 1, wherein said substrate is a monolithic body of semiconductor material, and said bipolar junction transistors have one current-carrying terminal thereof connected to a back surface of said substrate, and provide vertical current flow through the thickness of said substrate.

18. The device of claim 4, wherein said bipolar junction transistors are NPN transistors.

19. The device of claim 4, wherein said bipolar junction transistors have buried emitters.

20. The device of claim 4, wherein said substrate is a monolithic body of semiconductor material, and said bipolar junction transistors have one current-carrying terminal thereof connected to a back surface of said substrate, and provide vertical current flow through the thickness of said substrate.

21. The device of claim 8, wherein said bipolar junction transistors are NPN transistors.

22. The device of claim 8, wherein said bipolar junction transistors have buried emitters.

23. The device of claim 8, wherein said substrate is a monolithic body of semiconductor material, and said bipolar junction transistors have one current-carrying terminal thereof connected to a back surface of said substrate, and provide vertical current flow through the thickness of said substrate.

24. A monolithically integrated, transistor bridge circuit which is formed on a first surface of a semiconductor, being of a suitable type for power applications, comprising:

at least one transistor pair of an insulated-gate-bipolar (IGBT) type; and at least one pair of bipolar junction transistors, integrated with said insulated-gate-bipolar transistor pair;

wherein said insulated-gate-bipolar transistor pair and said bipolar junction transistor pair are interconnected in a bridge configuration, to provide complementary outputs in accordance with complementary inputs, with said insulated-gate-bipolar transistors each being connected to drive said outputs in a first direction and said bipolar junction transistor pair being connected to drive said outputs in a second direction; and wherein said bipolar junction transistors have buried emitters.

25. A monolithically integrated, transistor bridge circuit which is formed on a first surface of a semiconductor, being of a suitable type for power applications, comprising:

at least one transistor pair of an insulated-gate-bipolar (IGBT) type; and at least one pair of bipolar junction transistors, integrated with said insulated-gate-bipolar transistor pair;

wherein said insulated-gate-bipolar transistor pair and said bipolar junction transistor pair are interconnected in a bridge configuration, to provide complementary outputs in accordance with complementary inputs, with said insulated-gate-bipolar transistors each being connected to drive said outputs in a first direction and said bipolar junction transistor pair being connected to drive said outputs in a second direction; and wherein said substrate is a monolithic body of semiconductor material, and said bipolar junction transistors have one current-carrying terminal thereof connected to a back surface of said substrate which is opposite to said first surface.

26. The circuit of claim 12, wherein said bipolar junction transistors are NPN transistors.

27. The circuit of claim 12, wherein said bipolar junction transistors have buried emitters.

* * * * *